United States Patent
Nakamura et al.

(10) Patent No.: US 6,773,506 B2
(45) Date of Patent: Aug. 10, 2004

(54) METHOD FOR PRODUCING THIN FILM

(75) Inventors: Naoki Nakamura, Tokyo (JP); Naomi Fukumaki, Tokyo (JP); Takayuki Abe, Tokyo (JP)

(73) Assignee: NEC Electronics Corporation (JP)

( * ) Notice: Subject to any disclaimer, the term of this patent is extended or adjusted under 35 U.S.C. 154(b) by 51 days.

(21) Appl. No.: 10/162,728

(22) Filed: Jun. 4, 2002

(65) Prior Publication Data

US 2002/0187649 A1 Dec. 12, 2002

(30) Foreign Application Priority Data

Jun. 7, 2001 (JP) ........................................ 2001-172124

(51) Int. Cl.$^7$ .......................... C30B 25/02; C30B 25/04
(52) U.S. Cl. ............................. 117/89; 117/84; 117/95
(58) Field of Search .............................. 117/84, 89, 83, 117/95

(56) References Cited

U.S. PATENT DOCUMENTS 6,310,327 B1 * 10/2001 Moore et al. ................ 219/405

* cited by examiner

Primary Examiner—Felisa Hiteshew
(74) Attorney, Agent, or Firm—Ostrolenk, Faber, Gerb & Soffen, LLP

(57) ABSTRACT

A thin film producing method in which the wafer film forming processing for a wafer to be a product may be carried out efficiently to shorten the processing time and to raise the operating ratio of the device. In a thin film deposition method using a single wafer processing for forming a thin film by chemical reaction under heat, a pseudo-process is provided which operates to suppress variations in the film thickness caused by the temperature in a reaction chamber 11. This pseudo process is the preheating processing of heating the reaction chamber 11 before actually charging the wafer W into the reaction chamber 11.

16 Claims, 8 Drawing Sheets

METHOD FOR PRODUCING THIN FILM

FIELD OF THE INVENTION

This invention relates to a method for producing a thin film and, more particularly, to a method for forming a thin film on a wafer by chemical reaction under heat with a single wafer process.

BACKGROUND OF THE INVENTION

There has hitherto been known a method of producing a thin film on a wafer, by chemical reactions under heat, using a low-pressure chemical vapor deposition(termed as LP-CVD) system.

In forming a thin film on a wafer, with a single wafer process by using a LP-CVD system, the following procedure is used. First, before proceeding to processing, the inside of a process chamber is evacuated to a low pressure and heated until the atmosphere in the chamber is stabilized at a preset temperature, in order to make preparations for film deposition.

As the evacuated state is maintained, a single wafer is loaded into the chamber and held on a susceptor. Mixed gases are then introduced into the inside of the chamber. By introducing gases under a heated environment, a film deposition on the wafer is started and a thin film is formed on the wafer surface.

As the low pressure state in the chamber is maintained, the wafer, on which the thin film of a preset thickness has now been formed, is unloaded to outside the chamber and cooled. After taking out the wafer, the next wafer is loaded into the chamber and placed on the susceptor. The deposition of a thin film on the wafer and taking the wafer out of the chamber are sequentially executed. This sequence of operations then is carried out for each wafer.

It should be noted that, if, in the above-described a thin film forming method using a single wafer process, an LP-CVD device, on which the film-deposition processing has not been carried out for a prolonged time, heat dissipation from within the chamber is suppressed, while the power necessary for maintaining the preset temperature within the chamber is turned off, so that the atmosphere in the chamber is stabilized only gradually as from the time the film-forming process is started and hence a lot of time is taken until the atmosphere in the chamber is stabilized.

This situation also persists in case the LP-CVD unit is used next to cleaning and pre-coating or next to changing the working process temperature.

If the atmosphere in the chamber is stabilized only after lapse of long time, the film formed on the wafer surface becomes thin or it becomes impossible to attain the uniformity in the film thickness, at an initial state, when the film forming process is started, and hence film forming tends to be unstable. This problem is thought to be of particular significance. in consideration that, when the LP-CVD system, the need for which is increasing recently, is used for a temperature sensitive process, temperature control performs a crucial role in film thickness management.

In order to cope with this situation, the conventional practice has been to perform an advance film-forming processing (termed preparatory processing), using dummy wafers, for a time interval necessary for stabilizing the atmosphere within the chamber, prior to prosecution of the processing for forming a film on a wafer which is to be a product. The principal film forming processing (termed product processing) is then carried out after the atmosphere in the chamber has become stable.

FIG. 8 shows a timing chart for illustrating the conventional film forming process employing dummy wafers. In FIG. 8, preparatory processing for processing dummy wafers and product processing of processing a wafer which is to be a product, are first carried out in this order.

The preparatory processing is carried out by the following steps. On starting the process, a number of dummy wafers are loaded over about three minutes and the inside of a load-lock chamber is evacuated for about three minutes. The first dummy wafer is processed for about five minutes. The processing for the second wafer, the third wafer and so on is then carried out so that a sum total of 25 dummy wafers are processed.

The 25 wafers represent an ad-hoc measure in dummy wafer processing for accomplishing a stable film thickness in case of a single wafer process in which a single wafer is taken in and out one by one. Thus, the dummy wafer processing comes to a close in about 125 minutes, assuming that processing of each dummy wafer takes about five minutes, or in 131 minutes as from the start of processing.

After the end of the dummy wafer processing, the inside of the load-lock chamber is opened to atmosphere for about three minutes, after which the dummy wafers are unloaded in about three minutes. Thus, the preparatory processing of processing the dummy wafers takes about 137 minutes.

The product processing is carried out by the following process steps. Simultaneously with the start of the evacuation of the load-lock chamber in the preparatory processing, the processing is started and, after loading the wafer in approximately three minutes, the load-lock chamber is evacuated for about three minutes.

After the end of the dummy wafer processing in the preparatory processing, that is, after about 131 minutes as from the start of the processing, wafer processing is started. After processing the first wafer for about five minutes, the second wafer, the third wafer and so on are processed.

That is, since the film-forming process is started after the atmosphere in the chamber is stabilized by the processing of 25 dummy wafers, there is no risk that the thickness of the film is reduced or that the uniformity in the film thickness cannot be maintained.

SUMMARY OF THE DISCLOSURE

However, since 25 dummy wafers need to be processed as the preparatory processing before processing the products, the entire processing time necessary for forming a film of a wafer as a product is prolonged. This leads to the lowered operating ratio of the LP-CVD system to raise the wafer production cost.

Accordingly, it is an object of the present invention to provide a method for producing a thin film whereby the process of forming a thin film on a wafer to be a product is carried out efficiently to shorten the process time and to raise the operating ratio of a film forming device.

The above and other objects of the present invention are satisfied, at least in part, by providing a method for forming a thin film on a wafer by chemical reaction under heat with a single wafer type process, said method comprising: a pseudo-process provided after starting a process of forming a thin film, said pseudo-process operating to suppress variations in the film thickness caused by temperature in a reaction chamber.

In accordance with the present invention, a thin film is formed on the wafer by chemical reaction under heat, following the start of the thin film forming process, through a pseudo process of suppressing variations in the film thickness caused by temperatures within the reaction temperature. This enables the processing of forming a thin film on a wafer which is to be a product to execute efficiently for reducing the process time and hence the operating ratio of the film forming device is enhanced.

Still other objects and advantages of the present invention will become readily apparent to those skilled in this art from the following detailed description in conjunction with the accompanying drawings wherein only the preferred embodiments of the invention are shown and described, simply by way of illustration of the best mode contemplated of carrying out this invention. As will be realized, the invention is capable of other and different embodiments, and its several details are capable of modifications in various obvious respects, all without departing from the invention. Accordingly, the drawing and description are to be regarded as illustrative in nature, and not as restrictive.

PREFERRED EMBODIMENTS OF THE INVENTION

Figure 1:
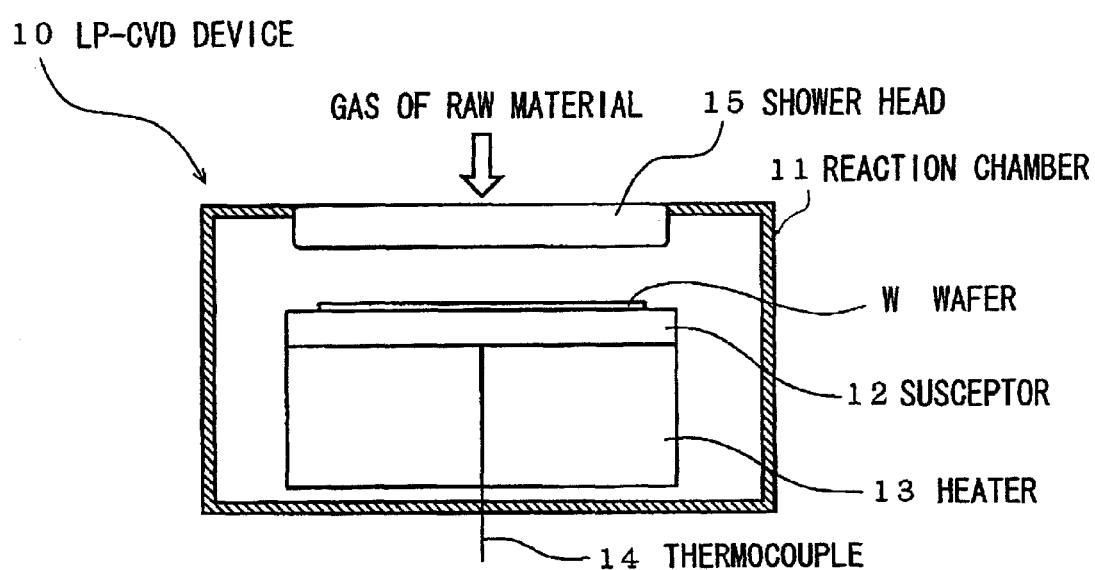
FIG. 1 is a cross-sectional view showing a schematic structure of a device used in a method for manufacturing a thin film according to an embodiment of the present invention.

Referring to the drawings, a preferred embodiment of the present invention will be explained in detail.

FIG. 1 shows a cross-sectional view showing a schematic structure of a manufacturing device used for practicing a method for manufacturing a thin film according to an embodiment of the present invention. As shown in FIG. 1, an LP-CVD device (thin film manufacturing device) 10 includes a susceptor 12 for holding a single type wafer W in a reaction chamber 11.

The susceptor 12 has, on its lower surface side, a heater 13 for heating the wafer W, held thereon, and a thermocouple (TC) 14 for temperature measurement, is arranged penetrating through the heater 13. Over the susceptor 12 there is provided a shower head 15 facing the wafer W as set on the susceptor 12. A raw material gas is supplied into the reaction chamber 11 through this shower head 15.

The process of forming a thin film on the single type wafer W by thermal reaction using this LP-CVD device 10, for example, a single wafer type LP CVD device for a silicon nitride (SiN) or a single wafer type LP CVD device for tantalum oxide ($Ta_2O_5$) is hereinafter explained.

It takes much time until the inner atmosphere is stabilized, due to, for example, change in the film-forming condition, to non-use of the reaction chamber for prolonged time or to directly previously executed cleaning of the reaction chamber, such that queuing time tends to be produced.

Figure 2:
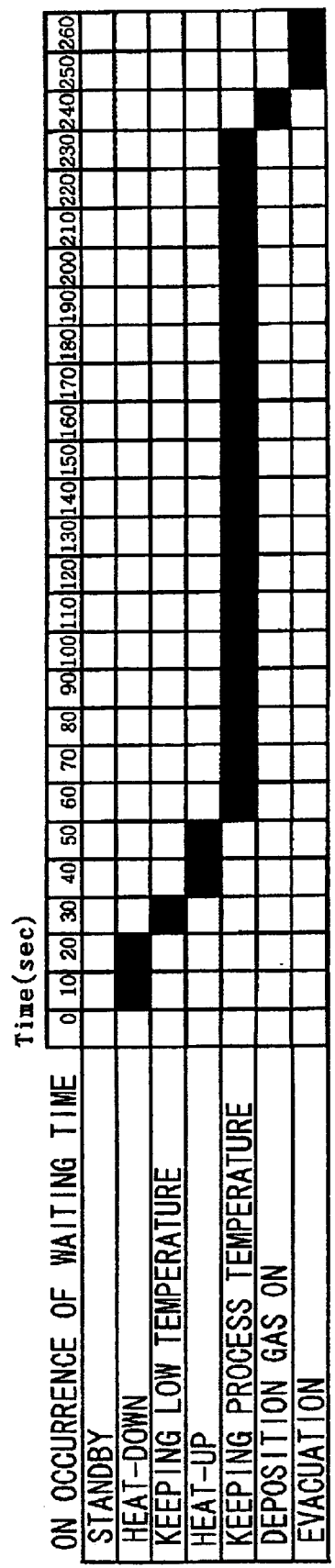
FIG. 2 is a timing chart similar to FIG. 1 showing the flow of pre-heating used on occurrence of waiting time in the single wafer type film forming process employing the LP-CVD device of FIG. 1.

FIG. 2 shows a timing chart showing the flow of the pre-heating that is carried out on occurrence of waiting time in the single wafer type film forming process employing the LP-CVD device shown in FIG. 1. The time lapse in the timing chart is schematically represented by partitioning with the unit time (approximately ten seconds).

As shown in FIG. 2, heat-down is carried out for about 20 seconds after standby and subsequently the temperature is kept at a value lower than the process temperature.

After keeping the low temperature, the heat-up is carried out for about 20 seconds to reach the process temperature. This process temperature is maintained for about 180 seconds. After the end of the period of maintaining the process temperature, the deposition gas ON state of introducing the process gas is set for about ten seconds, after which the evacuation is conducted for about 20 seconds.

The time of about 260 seconds as from this heat down until the evacuation represents the pre-heat time. If the waiting time occurs, the atmosphere in the reaction chamber 11 can be stabilized by carrying out the aforementioned pre-heating process procedure (recipe). The product processing for forming a thin film on the wafer W then is carried out.

Figure 3:
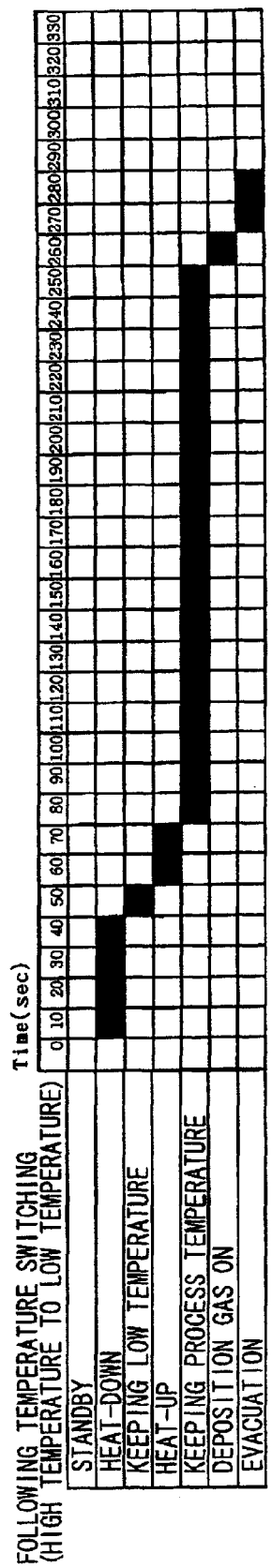
FIG. 3 is a timing chart similar to FIG. 2, showing the flow of each processing in case of setting the temperature from the low temperature to the high temperature on temperature switching in the reaction chamber.

FIG. 3 is a timing chart for illustrating pre-heating flow in case where the temperature is changed from high temperature to low temperature after temperature switching in the reaction chamber. The time lapse in the timing chart is schematically represented by partitioning with the unit time (approximately ten seconds).

If, after the temperature switching in the reaction chamber 11, the temperature is to be low temperature from high temperature, heat-down is carried out for about 40 seconds after stand-by and subsequently low temperature lower than the process temperature is maintained for about ten seconds.

After the low temperature is kept as described above, heat-up (heat-up following keeping the low temperature) is carried out for about 20 seconds to get to the process temperature, after which the process temperature is maintained or about 180 seconds. After the end of the period of keeping the process temperature, the deposition gas ON state of introducing the process gas is set for about ten seconds and evacuation is then conducted for about 20 seconds.

The time interval of about 280 seconds as from this heat-down until the evacuation represents the pre-heating time. If, after the temperature switching, the temperature is to be set to low temperature from high temperature, the atmosphere in the reaction chamber 11 can be stabilized by carrying out the process sequence of the pre-heating described above. The product processing of forming a thin film on the wafer W then is carried out.

Figure 4:
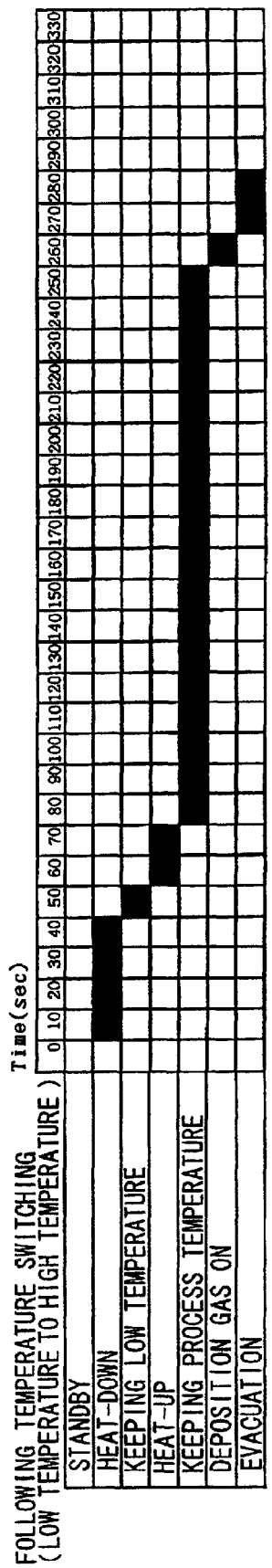
FIG. 4 is a timing chart similar to FIG. 2, showing the flow of each processing in case of setting the temperature from the high temperature to the low temperature on temperature switching in the reaction chamber.

FIG. 4 is a timing chart, which is similar to FIG. 2, for illustrating pre-heating flow in case where the temperature is changed from low temperature to high temperature after temperature switching in the reaction chamber. The time lapse in the timing chart is schematically represented by partitioning with the unit time (approximately ten seconds).

As shown in FIG. 4, when the temperature is to be set to the high temperature from the low temperature, on temperature switching in he reaction chamber, the heat-up (heat-up prior to keeping the low temperature) is carried out for about forty seconds after stand-by and subsequently the temperature lower than the process temperature is kept for about ten seconds.

After the low temperature is kept as described above, the heat-up is carried out for about 20 seconds to set the process temperature, which process temperature is kept for about 180 seconds. After the end of the process temperature keeping period, the deposition gas ON state of introducing the process gas is set, after which evacuation is conducted for about 20 seconds.

The time interval of about 280 seconds as from this heat-down until evacuation represents the pre-heating time. If, after the temperature switching, the temperature is to be changed from a low temperature to a high temperature, the atmosphere in the reaction chamber 11 can be stabilized by carrying out the process sequence of the pre-heating described above. The processing of forming a thin film on the wafer W as a final product then is carried out.

Figure 5:
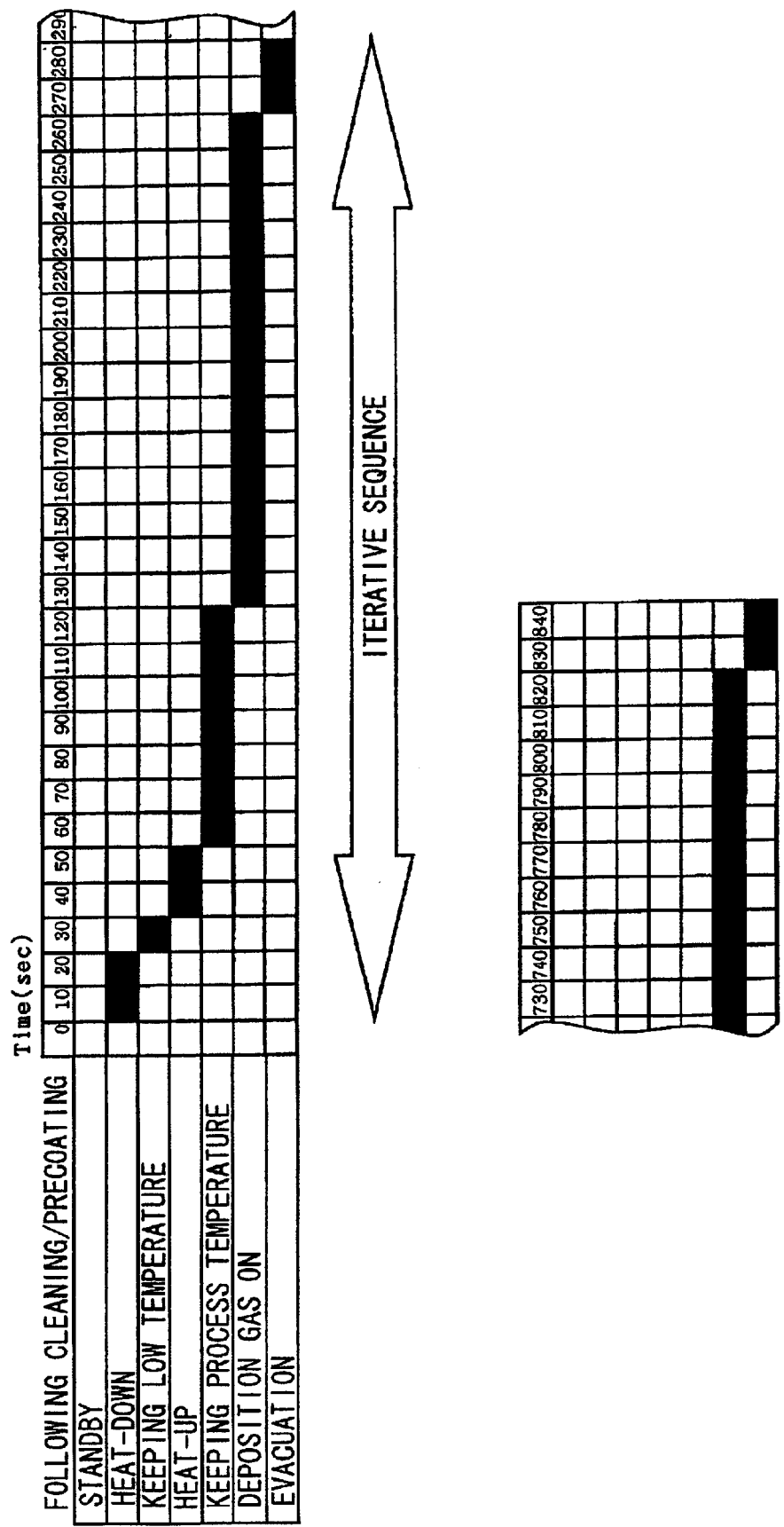
FIG. 5 is a timing chart similar to FIG. 2 showing the flow of each processing after cleaning pre-coating.

FIG. 5 is a timing chart which, similarly to FIG. 2, shows the flow of pre-heating following cleaning pre-coating. The time lapse in the timing chart is schematically indicated every unit time (approximately every ten seconds).

The heat-down is carried out for about 20 seconds, following stand-by, after the cleaning pre-coating. Subsequently, the temperature lower than the process temperature is kept for about ten seconds.

After the low temperature is kept as described above, heat-up is carried our for about 20 seconds to get to the process temperature, and the process temperature then is maintained for about 70 seconds. After the end of the period of maintaining the process temperature, the deposition gas ON state of approximately 140 seconds is set in order to introduce the process gas for pre-coating. Then, evacuation is carried out for about 20 seconds.

The time interval of approximately 280 seconds as from this heat-down until the evacuation indicates the pre-heating time. Subsequently, the process sequence of from 0 to 280 seconds is repeated three times as "iterative sequential processing". That is, after the cleaning precoating, followed by the preheating process sequence, the iterative sequential processing is repeated three times. Then, that is after 840 seconds, the atmosphere in the reaction chamber 11 can be stabilized. The product processing of forming a thin film on the wafer W is carried out.

Figure 6:
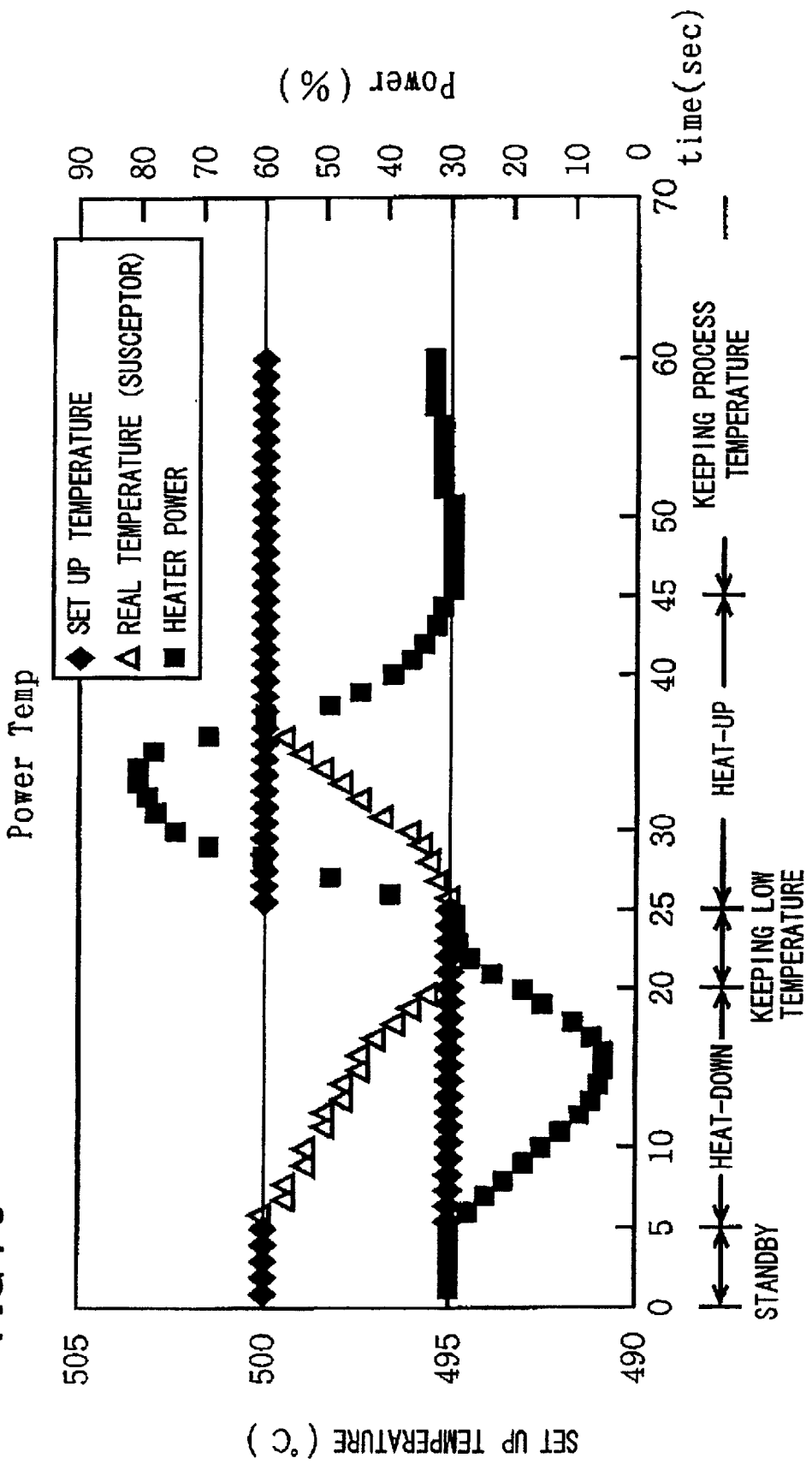
FIG. 6 is a graph illustrating transition of the setting temperature, real susceptor temperature and the heater power at the time of pre-heating of FIG. 2.

FIG. 6 shows, in a graph, transitions in respective parameters of the real susceptor temperatures and heater power at the time of pre-heating of FIG. 2. During the time preheating is carried out on occurrence of the waiting time, the real temperature and the heater power of the susceptor 12 on which the wafer W is placed are changed with respect to the set-up temperature of the reaction temperature 11, as shown in FIG. 6.

After the standby time of six seconds, the set-up temperature is lowered by about 5° C. from about 500° C. to about 490° C. This state is kept for about 20 seconds. In association with the lowering of the set-up temperature, the heater power is lowered from about 30% to about 5% (heat-down). Subsequently, the heater power is raised by about 30% after about 25 seconds as from the start of the processing to keep the state for about five seconds.

As the heater power is lowered, the real temperature is lowered gradually from about 500° C. to about 490° C. in about 20 seconds as from the start of the processing. Subsequently, as the heater power is maintained at about 30%, the real temperature is maintained at about 490° C. (low temperature keeping).

Subsequently, in about 25 seconds as from the start of processing, the set-up temperature is come back to and maintained at about 500° C. The heater power which, after being kept at about 30%, again continues to be raised, is raised to about 80% in about 35 seconds, as from the start of processing, in order to raise the rate of increase of the heater temperature (heat-up). With rise in the heater power, the real temperature starts to be increased in about 25 seconds as from the start of processing to reach the processing temperature, which is about 500° C., in about 37 seconds.

After about 35 seconds as from the start of processing, when the real temperature approached the setting temperature of about 500° C., the heater power, which was raised to about 80%, undertakes a change to a downturn and is lowered in about 45 seconds as from the start of processing to about 30%, which is the heater power capable of keeping the real temperature at about 500° C., in order to keep the process temperature.

In about 50 seconds as from the start of processing, the heater power is adjusted to a slightly higher value of 31% or 32%, as the real temperature is kept at about 500° C. Since this time, the real temperature in the reaction chamber 11 is kept stable at the process set-up temperature of about 500° C.

If, after temperature switching in the reaction chamber 11, the change from the high temperature to the low temperature is to be conducted, the temperature is temporarily lowered by heat-down by about 5° C. from the target temperature and the state of low temperature is kept. After keeping the low temperature, the temperature then is raised to reach the target temperature.

Since pre-coating is a object, the deposition gas ON time is as a matter of course prolonged. The time of keeping the process temperature since heat-up following heat-down is changed depending on which film is to be formed by which method, and hence the time of keeping the process temperature is adjusted, in dependence upon the film type to be formed, so that no change will be caused from the first wafer W. It should be noted that the number of times of repetition of the iterative sequential processing is not limited to three.

By increasing the heater power from about 30% at the time of start of keeping the process temperature to about 31% or 32%, the following merits are derived.

The real temperature inside of the reaction chamber 11, set to a constant temperature of approximately 500° C. during the film-forming process, is transiently lowered to about 495° C. at the time the wafer W is loaded. Thus, the heater power is raised to approximately 80%, in association with this lowering of the real temperature, each time the new wafer W is loaded. This process is repeated. However, the wafer processing is continued as the heater power is kept at an initial state of about 31% or about 32%. Thus, the temperature of the atmosphere in the reaction chamber keeps on to be higher by about 1 to 2° C., so that even if deviation on the order of 0.3 to 0.4 nm in the film thickness of the wafer W should occur in accordance with power fluctuations, it is possible to correct such deviation.

As described above, after a cycle (approximately 280 seconds) of the preheating of carrying out each processing from heat-down until evacuation, or after three repetitions of the cycle (approximately 840 seconds), by way of pre-processing, the processing of the wafer to be a product is carried out by way of product processing.

Figure 7:
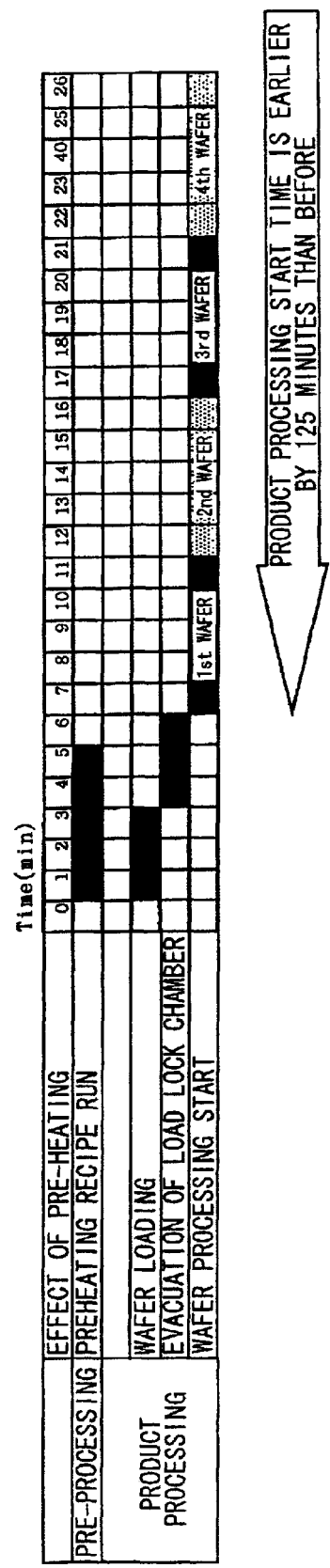
FIG. 7 is a timing chart for illustrating the film-forming processing step which is carried out through pre-heating according to the present invention.

FIG. 7 is a timing chart for illustrating the film-forming process which is carried out through the pre-heating according to the present invention. In this timing chart, the time lapse in the timing chart is schematically indicated every unit time (approximately every ten seconds).

As shown in FIG. 7, pre-heating processing sequence is carried out by way of pre-processing. Since the pre-heating process takes about 280 seconds, the pre-processing comes to a close in about five minutes since the start of the processing.

After the end of the pre-processing, the product processing is carried out by the following steps. That is, simultaneously with the start of execution of the pre-heating operation, as pre-processing, the loading of the wafer W commences, and is terminated in about three seconds. Subsequently, the load-lock chamber is evacuated for about three minutes.

After the end of evacuation of the load-lock chamber, that is, in about one minute since the end of the pre-processing, processing of the wafer W is started. The first wafer is processed in about five minutes, after which the second and the following wafers are processed so that about five minutes will be taken for each wafer.

Figure 8:
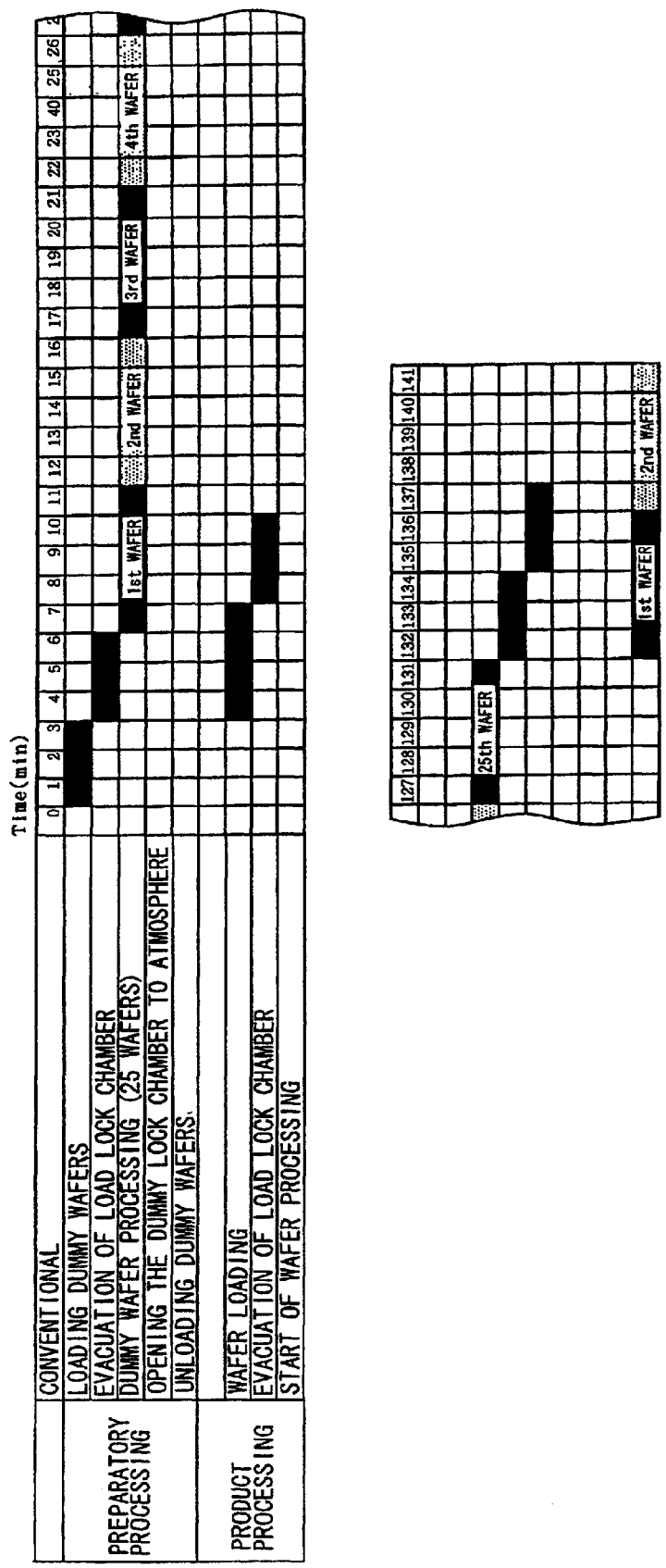
FIG. 8 is a timing chart for illustrating the film-forming processing step employing a conventional dummy wafer.

Thus, in the film forming processing, intervened by pre-heating, the product processing of the wafer W is carried out in about six minutes as from the start of the film forming processing. As a result, the time needed in the processing preparatory to the product processing of the wafer W (pre-heating time) may be reduced by about 125 minutes from about 131 minutes for he film forming processing employing the conventional dummy wafers (see FIG. 8) to about six minutes (see FIG. 7).

That is, in the single wafer type CVD process, solely inserting a sequential processing of transiently lowering the temperature of the CVD device to lower than the set-up temperature, by exploiting an automatic temperature controlling mechanism of the CVD device and keeping such lower temperature, before starting the process of forming a film on the wafer W, it is possible to shorten the time previous to the product processing start time by about 125 minutes as compared to that in the conventional practice.

Thus, in the present invention, the pre-heating operation of temporarily lowering the temperature from the operating temperature used in the process by way of heat-down followed by reverting the temperature to the process temperature' is carried out in a sequence of film-forming processes, before actually forming the film on the wafer W, and the operation of forming a film on the wafer W is started after reversion to the process temperature.

The temperature for heat-down is set to low temperature which is lower by a value corresponding to temperature variation caused on loading the wafer W into the reaction chamber 11, specifically, to the temperature lower by not larger than about 30° C., preferably not larger than about 10° C., more preferably not larger than about 5° C., with respect to the operating process temperature. More efficient operation is possible when the temperature is set to a value lower by not larger than about 5° C.

That is, if the reaction chamber 11 has not been used for prolonged time, or the operating process temperature is changed, such as by carrying out cleaning-pre-coating or by changing the film-forming conditions, the heater temperature is changed for heat-down or the process gas is caused to flow for several minutes for pre-heating, as necessary, after which the product processing is carried out. As a result, the film may be formed to a stable film thickness on the wafer W without being affected by the state in the reaction chamber 11 prevailing directly previous to the use of the reaction chamber for the film-forming process.

The reason is that, since there is caused a difference between the atmosphere in the reaction chamber 11 (such as heater power or gas atmosphere) in case product processing is carried out continuously and that in case product processing is not carried out continuously, the film formed is fluctuated in thickness depending on the state in the reaction chamber 11, if the reaction chamber is used as it is, however, such fluctuations in the film thickness can be suppressed through the processing sequence (recipe) of carrying out pseudo-wafer processing prior to the start of principal process.

Since the product processing following the pre-heat according to the present method enables accurate and stabilized temperature control at the time of the film deposition, the present method is effective in a temperature-sensitive process in which temperature control and management influences the film thickness extremely delicately, as in the case of the recent LP-CVD process.

In the case of forming a $Ta_2O_5$ film, as an example, in which the film thickness is on the order of 10 nm and film thickness shifting with respect to temperature is significant, a shift of not less than 1° C. results in a fail. On the other hand, a SiN film, with a film thickness of the order of 100 nm, undergoes a film thickness shift with respect to temperature which is about five times as much as that in case of forming the $Ta_2O_5$ film, so that the temperature control management is relatively not severe.

Thus, with the thin film forming method of the present invention, in which the film thickness of the wafer W in the film forming processing step is stabilized from the first wafer, and hence the dummy processing time, needed in the conventional process, is not needed, thus appreciably diminishing the preparatory operating time to improve the operation efficiency in wafer processing as well as to improve the operating ratio of the LP-CVD device.

In particular, the present method is effective in case the CVD device has not been used for long, for example, for one hour or longer, when there has been no heat input/output for the reaction chamber due to, for example, cleaning pre-coat, or in case the temperature needs to be stabilized following temperature change.

Moreover, the process operations in product processing can be achieved in a short time by changing the controllable temperature set-up parameters, that is by simply changing the temperature set-up sequence, without changing the device structure. In addition, since it is only necessary to change the sequence, it is possible to load another wafer in the interim.

The CVD process in the above embodiment is not limited to the SiN LP single wafer type CVD process or to $Ta_2O_5$ leaf CVD process, but may be adapted in general to the single wafer type CVD process for heat film deposition based on chemical reaction under heat, or to process employing a single wafer type lamp annealing system. A lamp annealing system which is able to conduct rapid temperature elevation and descent is used for oxidation process or diffusion process at high temperature with short time such as RTA(rapid thermal anneal) or RTO(rapd thermal oxidation) and the pseudo-process in accordance with the present invention may be also applied in the single wafer type lamp-anneal process.

The meritorious effects of the present invention are summarized as follows.

According to the present invention, as described above, a thin film is formed by a thermally induced chemical reaction on a single type wafer through a pseudo-process of suppressing film thickness variations due to temperature in the reaction chamber after the start of the thin film forming process. The result is that the process time can be shortened by carrying out the wafer film forming process for a product efficiently and the operating ratio of the thin film forming device can be improved.

It should be noted that other objects, features and aspects of the present invention will become apparent in the entire disclosure and that modifications may be done without departing the gist and scope of the present invention as disclosed herein and claimed as appended herewith.

Also it should be noted that any combination of the disclosed and/or claimed elements, matters and/or items may fall under the modifications aforementioned.

What is claimed is:

1. A method for forming a thin film on a wafer by a chemical reaction under heat with a single wafer process, said method comprising:
   a preparation step provided after starting a process of forming a thin film, said preparation step operating to suppress variations in the film thickness caused by temperature in a reaction chamber.

2. The method as defined in claim 1 wherein said pseudo process is carried out under a condition in which time is taken until inner atmosphere in the reaction chamber is settled, such as when film-forming condition is changed, when the reaction chamber has not been used for long or after the reaction chamber has been cleaned.

3. The method as defined in claim 1 wherein said pseudo-process is pre-heating processing for heating said reaction chamber before actually introducing said wafer into said reaction chamber.

4. The method as defined in claim 3 wherein said pre-heating processing includes a low temperature keeping sequence of transiently keeping temperature lower than process temperature.

5. The method as defined in claim 4 wherein the temperature being kept in the low temperature keeping sequence is set so as to be lower than said process temperature by a value corresponding to temperature variation caused on actually introducing the wafer into said reaction chamber.

6. The method as defined in claim 4 wherein said pre-heating processing includes:
   a heat-down step for effecting heat-down with respect to said process temperature;
   a low temperature keeping step for keeping temperature lower than said process temperature after the heat-down step; and
   a heat-up after keeping a low temperature step for effecting heat-up to said process temperature after the low temperature keeping step.

7. The method as defined in claim 6 wherein a heat-up step for heating up to said process temperature prior to the low temperature keeping step is provided in place of said heat-down step.

8. The thin film forming method as defined in claim 7 further comprising:
   a process temperature keeping step for keeping said process temperature after said heat-up after keeping a low temperature step;
   a deposition gas turn-on step for turning a state of a deposition gas on to introduce a process gas after said process temperature keeping step; and
   an evacuation step for effecting evacuation after said deposition gas turn-on step.

9. The method as defined in claim 6 further comprising:
   a process temperature keeping step for keeping said process temperature after said heat-up after keeping a low temperature step;
   a deposition gas turn-on step for turning a state of a deposition gas on to introduce a process gas after said process temperature keeping step; and
   an evacuation step for effecting evacuation after said deposition gas turn-on step.

10. The method as defined in claim 9 wherein along with said pre-heating processing, said wafer is loaded and subsequently a load-lock chamber is evacuated, and wherein
    product processing of forming a thin film on said wafer is carried out after said pre-heating processing.

11. The method as defined in claim 6 comprising
    an iterative sequential processing including:
    (a) said pre-heating process step;
    (b) a process temperature keeping step for keeping said process temperature after said heat-up after keeping a low temperature step;
    (c) a deposition gas turn-on step for turning a state of deposition gas on to introduce a process gas for pre-coating following said process temperature keeping step, and
    (d) an evacuating step of effecting evacuation after said deposition gas turn-on step, wherein the iterative sequential processing iterates the steps (a) to (d).

12. The method as defined in claim 11 wherein along with said iterative sequential processing, said wafer is loaded and subsequently a load-lock chamber is evacuated, and wherein
    product processing of forming a thin film on said wafer is carried out after said iterative sequential processing.

13. The method as defined in claim 6 wherein along with said pre-heating processing, said wafer is loaded and subsequently a load-lock chamber is evacuated, and wherein
    product processing of forming a thin film on said wafer is carried out after said pre-heating processing.

14. A method for forming a thin film on a wafer using a single wafer chemical vapor deposition system in which the thin film is deposited on the wafer by chemical reactions taking place at a preset temperature in a reaction chamber into which process gases are provided, said method comprising the steps of:
    pre-heating said reaction chamber before loading a wafer into the reaction chamber; and
    forming a film on a wafer by chemical reactions taking place at a preset process temperature after said pre-heating step.

15. The method as defined in claim 14 wherein the pre-heat ng process includes the steps of:
    effecting heat-down with respect to said process temperature;
    keeping temperature lower than said process temperature; and
    effecting heat-up to said process temperature.

16. A method for annealing a wafer using a single wafer lamp anneal system, said method comprising the steps of:
    pre-heating said reaction chamber before loading a wafer into the reaction chamber; and
    annealing a wafer after said pre-heating step.

* * * * *